United States Patent [19]

Ma et al.

[11] 3,946,319
[45] Mar. 23, 1976

[54] ALL ELECTRONIC DIGITAL TUNER SYSTEM WITH MEMORY

[75] Inventors: John Ma, Glenview; Akio Tanaka, Evanston, both of Ill.

[73] Assignee: Zenith Radio Corporation, Chicago, Ill.

[22] Filed: May 3, 1974

[21] Appl. No.: 466,579

[52] U.S. Cl. ............... 325/459; 325/464; 325/470; 334/15
[51] Int. Cl.² ........................................ H04B 1/16
[58] Field of Search ........... 325/452, 453, 458, 459, 325/464–466, 468–470; 178/DIG. 15; 334/11, 14, 15; 331/177–179; 340/147 C, 171 A

[56] References Cited
UNITED STATES PATENTS

| | | | |
|---|---|---|---|
| 3,651,469 | 3/1972 | Keese .............................. | 340/168 R |
| 3,800,230 | 3/1974 | Marks et al. ....................... | 325/396 |
| 3,803,495 | 4/1974 | Reynolds ............................. | 325/470 |
| 3,822,405 | 7/1974 | Sakamoto .......................... | 325/464 |
| 3,845,394 | 10/1974 | Hamada ............................ | 325/455 |

Primary Examiner—George H. Libman
Assistant Examiner—Marc E. Bookbinder
Attorney, Agent, or Firm—Joseph T. Downey; Nicholas A. Camasto

[57] ABSTRACT

An all-electronic television tuning system has a sequentially accessible multi-position two digit memory coupled to a viewer controlled channel number selection means for providing storage and recall of selected two digit channel numbers in a sequence established by loading selected channel numbers into fifteen of sixteen serial memory locations. The system has program and operate modes, corresponding respectively to storage and recall of channel number information, and the memory has a sixteenth, particular location accessible only in the operate mode for providing immediate all channel tuning control for the viewer irrespective of the pre-programmed channel number sequence.

10 Claims, 3 Drawing Figures

ALL ELECTRONIC DIGITAL TUNER SYSTEM WITH MEMORY

This application is related to the following applications all of which are assigned to the assignee of the present application: Ser. No. 430,446, filed Jan. 3, 1974, entitled "Channel Seeking Tuning System" in the name of Akio Tanaka which is hereby incorporated by reference and hereafter referred to as the "Tanaka application;" Ser. No. 457,010, filed Apr. 1, 1974, entitled "Digital Signal Seeking Tuning System" in the names of John Ma and Akio Tanaka which is hereby incorporated by reference; Ser. No. 484,475, filed July 1, 1974, entitled "Band Decoder for All Channel Digital Tuning System" in the name of Akio Tanaka; Ser. No. 492,365, filed July 29, 1974, entitled "Signal Seeking Tuning System with Illegal Channel Detection" in the name of Akio Tanaka; Ser. No. 503,122, filed Sept. 4, 1974, entitled "Television Tuning System with Varactor Malfunction Detection" in the name of Akio Tanaka; Ser. No. 504,638, filed Sept. 9, 1974, entitled "Multi-Speed Ramp for a Varactor Tuning System" in the names of Melvin C. Hendrickson and Richard G. Merrell, and Ser. No. 511,837, filed Oct. 3, 1974, entitled "Television Tuning System Indicator" in the name of Akio Tanaka.

BACKGROUND OF THE INVENTION

1. Field of the Invention

The present invention relates generally to television tuning systems and more particularly to all-electronic tuning systems which operate to recall a programmed sequence of channel numbers.

2. Description of the Prior Art

Early suggested digital television tuning systems employed various forms of information retention. As early as 1969 a paper by Doyle and Mills, BTR 15, No. 2, July 1969, showed a diagram with a shift register coupled to a push buttom panel feeding information to a comparator in a system using a frequency snythesizer tuning technique. The shift register operated as a temporary storage device for the process of relating the encoded information to a birdy or comb frequency.

U.S. Pat. No. 3,654,557 to Sakamoto and Ichinohe, dated Apr. 4, 1972, described a tuning system for selecting from among a limited number or preselected channels having a maximum capacity of 12 VHF and 4 UHF television channels. Binary switching is used to activate an individual potentiometer for applying an appropriate voltage to a varactor tuner. Such a memory system is similar to the selective retrieval and memory system of U.S. Pat. No. 3,739,342 to Kortenhaus, dated June 12, 1973, for selectively retrieving articles such as record discs in an automatic photograph. In both instances a binary encoded signal is used to activate an individual memory location to operate or access whatever circuit function or article is associated with the location.

A paper by Sakamoto and Ichinohe, BTR 18, No. 3, August 1972, describes logic circuitry for a 10 key decimal channel number selection system which employs an encoder and an eight bit shift register for converting binary coded channel numbers, through a matrix system, to activate a corresponding potentiometer for tuning. This permits the viewer to input or select a desired channel number, with the shift register acting to store the encoded channel number and supplying a static signal to the switching matrix. To accomodate all-channel tuning, 82 separate potentiometers are necessary.

U.S. Pat. No. 3,748,645 to kawashima July 24, 1973, employs a "dynamic" memory in conjunction with a shift register to provide tuning. Here a pulse train generates the binary codes associated with the locations of the various tuning potentiometers. The channel number codes may be sequentially generated to provide a "sweep" through the FCC allocated set of channel numbers. Separate shift registers are provided for the temporary storage of the generated channel number units and tens digits.

The above-mentioned Tanaka application discloses and claims methods and apparatus for a television tuning system employing a comparator for comparing an asynchronously counted local oscillator frequency (expressed in terms of channel numbers and modular residue corresponding to intrachannel fractions) with encoded input channel number information. A voltage ramp drives the tuner until a condition of equality exists between the derived and desired channel numbers and the modular residue is within predetermined limits. Thus the tuning system responds to a two digit channel number input to tune to a restricted frequency range or "window" about the frequency corresponding to the designated channel number. With this system fine tuning is not required, and programming or set-up of the receiver is unnecessary. The Tanaka tuning system not only provides equal access all-channel tuning but also discloses the channel recall or memory system of this invention. The memory system may be programmed in any desired sequence, to provide sequential tuning among a selected group of channels. The advantage of such a system is readily apparent since the viewer need only operate a single button, or send a single appropriate remote control signal, to change tuning of the receiver to the next preset channel. While the total tuning system including the multi-position memory is fully described in the Tanaka application, this invention is specifically directed to the multi-position memory aspect. As will be seen, the tuning system of this invention also allows the viewer to directly tune to any desired channel without affecting the programmed channels in the memory.

OBJECTS OF THE INVENTION

An object of this invention is to provide a novel all-electronic, all-channel television tuning system;

It is another object of this invention to provide a novel all-electronic television tuning system responsive to a pre-programmed sequence of selected channel numbers; and It is a further object of the invention to provide a novel all-electronic television tuning system providing direct tuning access to the viewer at all times.

SUMMARY OF THE INVENTION

In accordance with the invention, an all-electronic television tuning system includes a voltage controllable oscillator means for tuning a plurality of fixed frequency bandwidth television channels, means encoding the tuning frequency of the oscillator into channel number information of the corresponding receivable channels, channel number selection means, comparison means, comparing the information from the channel number selection means with the information from the oscillator, and ramp voltage generator means for changing the tuning frequency of the oscillator under control of said comparison means. The tuning system has a program mode permitting storage of channel number information from the channel number selection means, an operate mode permitting recall of channel number information for supplying input information to said comparison means and memory means interposed between the channel number selection means and said comparison means having a plurality of storage locations with a particular location accessible for information storage only in the operate mode.

BRIEF DESCRIPTION OF THE DRAWINGS

The features of the present invention which are believed to be novel are set forth with particularity in the appended claims. The invention, together with further objects and advantages thereof, may best be understood by reference to the following description taken in conjunction with the accompanying drawings, in the several figures of which like reference numerals identify like elements, and in which:

DESCRIPTION OF THE PREFERRED EMBODIMENT

Figure 1:
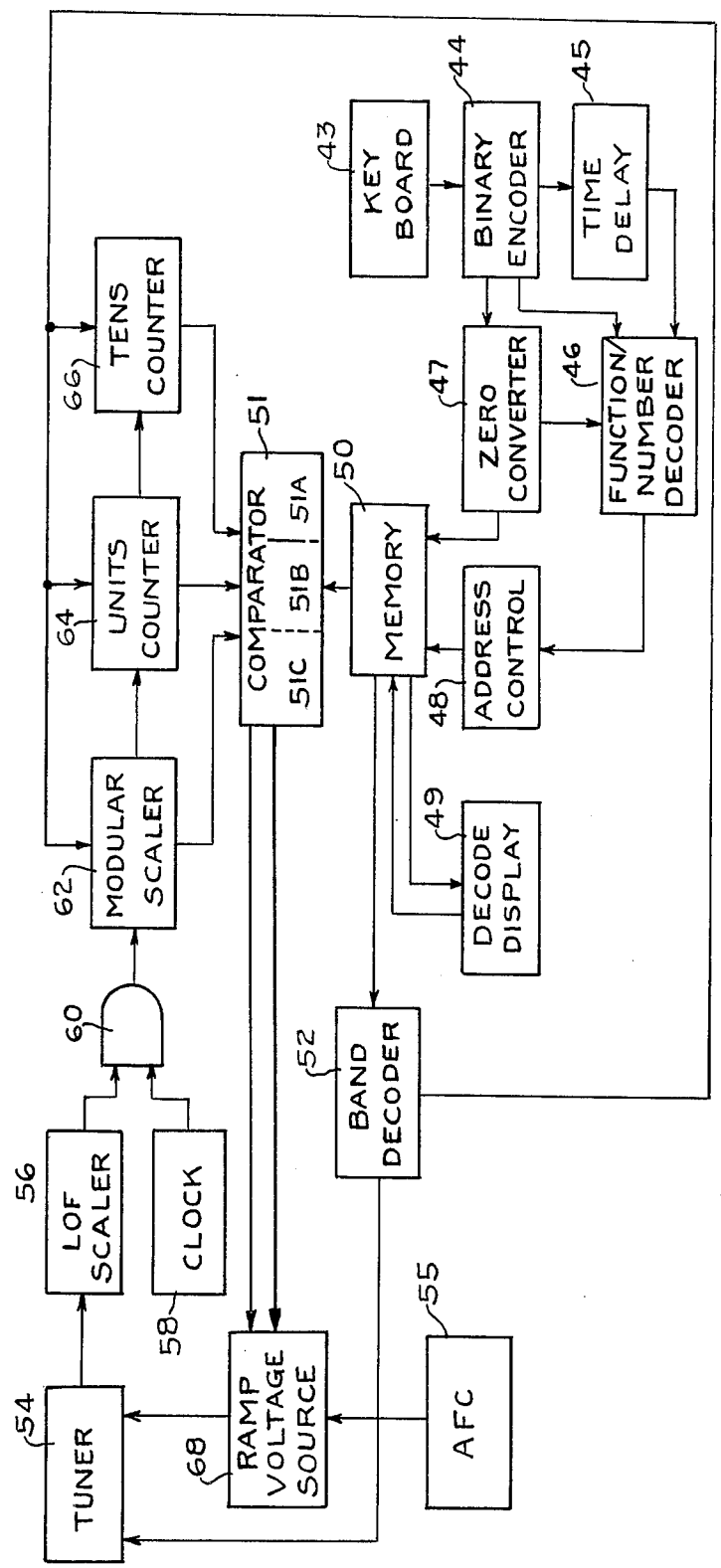
FIG. 1 depicts, in block diagram form, a tuning system employing the invention.

FIG. 1 is a block diagram depicting a tuning system incorporating the invention. A channel number keyboard 43 includes means for entering either desired channel number information or tuning commands to tune the tuner. The keyboard information is encoded into a special binary representation in encoder 44, supplied to a zero converter 47 and, both directly and through a time delay system 45, to a function/number decoder 46. The purpose of time delay system 45 is to eliminate spurious signals which might be generated by keyboard contact bounce. The directly supplied information to decoder 46 assists in the determination of the proper address or position in a memory 50. As will be explained later in detail, zero converter 47 functions to alter the special binary representation used in the encoder to the standard binary representation employed in the remainder of the system. The output of zero converter 47 supplies channel number information to decoder 46 and to a designated position in memory 50.

The keyboard input can be either a channel number digit or an Up or Down tuning command. The word "command" is used throughout to indicate an Up or Down signal input. The function/number decoder firstly determines which of an Up or Down command has been given and secondly distinguishes between commands and channel numbers. If an Up or Down command is entered at the keyboard, address control 48 causes an advance to the next position of the memory. Additional commands result in address control 48 sequentially indexing memory 50 through its available memory positions. Connected to the output of memory 50 is a decode display 49 which provides a visual indication of the channel number at that memory address. Thus, the viewer receives a visual indication of the selected channel information.

The tuning system has two functional modes designated program and operate. In the program mode, information is entered by the keyboard and stored in the memory by the sequence of an Up or Down command which cause a serial advancement of accessible memory address positions followed by entry of the channel number information into the memory from the keyboard. In the operate mode, an Up or Down command causes advancement to the next sequential address position and information is supplied from the memory to a comparator 51 to cause tuning to the channel represented by the stored channel information. In this mode, a particular location or "scratch pad" memory position is automatically accessed upon the input of a channel number at the keyboard and permits direct tuning by the viewer to any selected channel.

Another output of memory 50 is connected to a band decoder 52 which determines, from the encoded channel information stored in memory 50, (1) in which of the several discontinuous frequency bands the selected channel is; (2) whether UHF or VHF circuitry in the tuner is activated; and (3) the preset information supplied to the channel computing means for decoding of the oscillator frequency. Thus, an output of band decoder 52 is connected to a varactor tuner 54 and another output is connected in common to a modular scaler 62, a units counter 64 and a tens counter 66. A conventionally derived automatic frequency control voltage source (AFC) 55 is coupled to a ramp voltage source 68 for maintaining the oscillator frequency tuned to the received signal picture carrier frequency.

The output of a local oscillator frequency (LOF) scaler 56 and the output of a clock pulse generator 58 are coupled to the inputs of a logic gate 60. The signal on the output of gate 60 constitutes the tuning information and comprises a train of oscillator frequency-related pulses in fixed time intervals. The oscillator frequency is determined by counting the number of pulses in an interval. The output of logic gate 60 is connected to modular scaler 62 which, in turn, is connected to units counter 64 which, in turn, is connected to tens counter 66. On a time sample basis, the tuning information is supplied to the appropriately preset modular scaler and counters which, in the preferred embodiment, determine the channel number corresponding to the television frequency to which the tuner is tuned. The circuitry from the LOF scaler to the comparator constitutes the channel computing means.

The outputs of modular scaler 62 and counters 64 and 66 are connected to comparator 51 which has a modular section 51C, a units section 51B and a tens section 51A, where the derived channel number is compared with the desired channel number. As each comparison is made, signals dependent upon the condition of comparator 51 are coupled to ramp voltage source 68 for controlling both the tuning voltage direction and rate of change. The output voltage from ramp voltage source 68 drives tuner 54 to make corrective changes in its local oscillator frequency, until comparator 51 indicates equality between the derived channel number and desired channel number and, as will be described, that the tuned signal is within a range of frequencies preselected by the window.

DEFINITIONS

For simplicity, only logic connections are shown in the figures and only voltage sources and grounds necessary to establish the logic control signal levels are shown. Positive logic is used throughout and logic gates are simply referred to by their functional names, i.e., AND NAND, OR and NOR, without the word "gate". A 1 represents a high logic (or signal voltage) level and a 0 corresponds to a low logic level. Thus, an AND gate has its output at 1 only if all inputs are at 1; a NAND gate has its output at 0 only if all inputs are at 1; or OR gate has its output at 1 if any input is at 1; and a NOR gate has its output at 0 if any input is at 1. Inverters function to interchange and the 1 and 0 levels.

All binary representations are conventionally arranged in descending powers of 2 from left to right. Leads labelled D, B, C and A and D' and C' interchangeably represent binary digits or bits as well as lead identification. Similarly leads may be identified by the functional signals they carry.

The terms "input" and "output" generally indicate the device terminal unless signal is specified. An open circle on an input terminal designates a negative edge triggered device. $\phi$ represents a timing pulse signal and $\overline{\phi}$ its inverse or complement. If $\phi$ is 0, $\overline{\phi}$ is 1 and vice-versa. The term "inhibit" indicates the condition in which a gate output is no longer dependent upon signals applied to its remaining inputs. The term "enable" designates the condition in which a gate output is dependent upon the signals applied to the remaining inputs.

Figure 2:
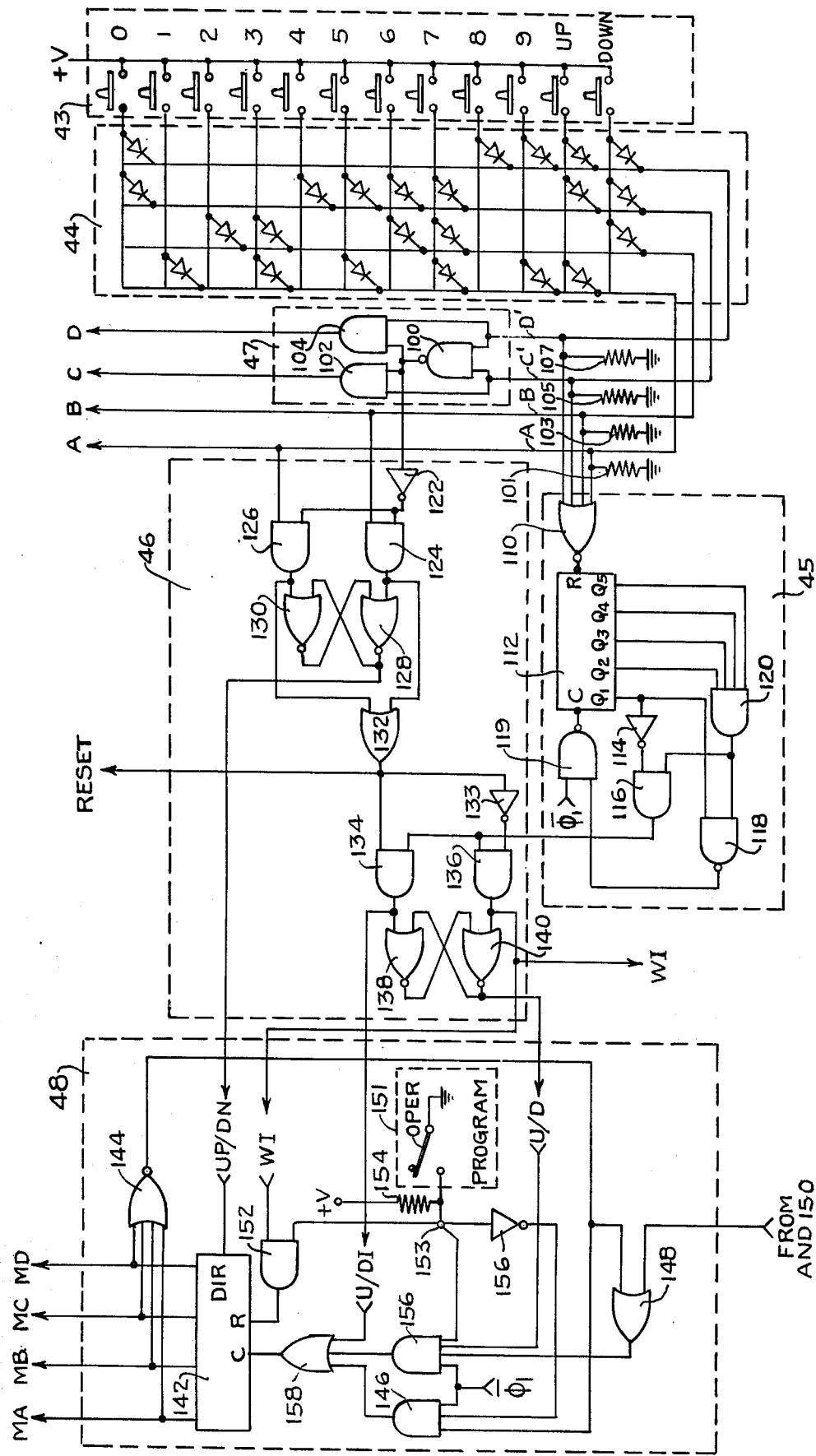
FIG. 2 shows the circuitry of blocks 43, 44, 45, 46, 47 and 48 of FIG. 1 which comprise the keyboard input arrangement, the function-number decoder and address control.

Keyboard 43 and Binary Encoder 44 (FIG. 2)

FIG. 2 shows the channel number selection means and includes binary encoder 44 comprising a diode matrix for encoding digits entered at keyboard 43. A source of positive voltage +V is applied to a parallel arrangement of switches, bearing appropriate identification in the form of digits 0–9 and Up and Down commands. The switches shown are single pole, single throw momentary contact type, but may be of any other suitable type. Each switch is selectively coupled by the diode matrix to an arrangement of four resistors 101, 103, 105 and 107 which are returned to ground. Switch operation establishes voltages on the resistors which correspond to the binary bit representation of the identifying digit or command associated with the selected switch. Voltages established on resistors 101, 103, 105 and 107 correspond respectively to the A, B, C' and D' special binary bit representations.

Assume channel 29 is desired. The switch corresponding to the digit 2 is momentarily depressed and connects +V, through the appropriate diode in the matrix, to resistor 103. Resistor 103 is connected to lead B, which now has +V thereon (ignoring the small voltage drop across the diode), the remaining leads A, C' and D' being at ground potential. Thus the digit 2 is encoded, the configuration of binary bits being 0010 for D', C' B and A, respectively, where 1 represents +V and 0 represents ground.

The switch designated by the digit 9 is now momentarily depressed, which places +V, through the diode matrix, on resistor 107 and resistor 101. These resistors are connected, respectively, to the D' and A leads. Thus the binary representation for the digit 9 is 1001. In similar fashion, keyboard 43 and diode matrix 44 function to encode the remaining digits and commands. The Up command is encoded as binary 1101 for D' C' BA and the Down command as binary 1110.

Zero Converter 47 (FIG. 2)

The special keyboard binary representation does not conform to the standard binary representation upon which the memory and other system components operate. Since it is desirable for the keyboard to have a rest position with no signal level being established, the standard binary configuration corresponding to the digit zero is chosen. Hence at rest, zero voltage levels are established on leads D' and C' BA. For digit zero the standard binary representation for the decimal number 12 is used, namely, 1100.

Zero converter 47 re-encodes the D' and C' BA representation into standard DCBA form. C' and D' connect to the inputs of a NAND 100. C' and the output of NAND 100 connect to the inputs of an AND 102 and the output of NAND 100 connects to an input of an AND 104, with D' connecting to its other input. The output of AND 102 appears on lead C and the output of AND 104 appears on lead D, both corresponding to their counterparts C and D in the standard binary representation DCBA.

As mentioned above, the digit 9 keyboard binary representation on leads D', C', B and A is 1001. C' is at 0 and and D' is at 1 and hence the inputs of NAND 100 are at 0 and 1. The output of NAND 100 is thus at 1 and the corresponding inputs of AND 102 and AND 104 are at 1. The two inputs of AND 102 are now at 0 and 1 and its output is at 0, while the inputs of AND 104 are both at 1 and its output is at 1. Leads C and D are respectively at 0 and at 1. Thus the leads D, C, B and A are respectively 1001 and the zero converter has had no effect.

However, a zero digit has the keyboard binary representation 1100. C' and D' are both at 1. The inputs of NAND 100 are both at 1 and its output is at 0. One input each of AND 102 and AND 104 is at 0 and their outputs are at 0. The corresponding standard C and D binary bits are zero. Since the A and B binary bits are not affected by the zero converter, they are still at 0 and the keyboard special representation of zero (1100) is converted to the standard binary representation of 0000.

Time Delay 45 (FIG. 2)

As mentioned, a time delay is provided to delay interpretation of the keyboard binary signal to preclude response to false signals due to contact bounce. Time delay 45 employs a five stage counter 112 which delays the enabling of subsequent logic gates for thirty increments or one level pulses of the clock output timing signal $\overline{\phi}_1$. $\overline{\phi}_1$ is selected for convenience but any other suitable pulse recurring each clock cycle may be employed for this purpose. Leads A, B, C' and D' are connected to the input of a NOR 110 whose output is connected to the reset terminal (R) of time delay counter 112. The Q1 output of counter 112 connects to one input of a NAND 118 and, after coupling through an inverter 114, connected to an input of an AND 116. The Q2–Q5 outputs of counter 112 connect to the four inputs of an AND 120. The output of AND 120 is coupled to the second input of each of AND 116 and AND 118. The output of NAND 118 and clock signal $\overline{\phi}_1$ connect to the inputs of a NAND 119 whose output is connected to the clock terminal (C) of counter 112. The circle on the input terminal of counter 112 indicates that it is a negative edge triggered device, a conventional employed throughout the description. The output of AND 116 connects to one input each of an AND 134 and an AND 136 for enabling these gates after the desired time delay.

A keyboard input which does not correspond to the rest position of 0000 causes NOR 110 to go to a 0 level at the output which resets counter 112. The Q5–Q1 outputs of counter 112 indicate its count status in standard binary from and upon reset, are all at 0. As will be seen shortly, for this condition and during 29 subsequent $\overline{\phi_1}$ time pulses, the output of AND 116 is at 0, inhibiting gates 134 and 136. During this period, the output of AND 120 is at 0 and NAND 118 has a 1 level signal output which is applied with each 1 level $\overline{\phi_1}$ clock pulse on the inputs of NAND 119. For each occurrence of $\overline{\phi_1}$ at 1, the resulting 0 level output signal from NAND 119 is coupled to the clock input terminal of counter 112 and advances the counter one binary count.

The enabling of subsequent logic gates is delayed until counter 112 reaches a predetermined status. When counter 112 achieves the binary number, 11110 (Q5–Q1 respectively), which is a decimal count of 30, the normally 0 signal level output of AND 120 becomes a 1 signal level since outputs of Q2–Q5 are now all at 1. The 0 signal level at the Q1 output is coupled through inverter 114, resulting in the second input of AND 116 being at 1 and in AND 116 producing a 1 level output signal for enabling AND's 134 and 136. These gates remain enabled for one complete clock period, i.e., from the 30th to the 31st $\overline{\phi_1}$ at 1 pulse, which also determine the length of the "initiate" pulses in subsequent circuitry. Note that binary number 11110 in counter 112 is the only possible enabling count for 134 and 136 since no other count in the permissible range between 00000 and 11111 will result in both inputs of AND 116 being at 1. When the counter reaches 11111 the enabling pulse is terminated and the counter remains at this status awaiting another reset condition. Thus, the desired time delay is achieved.

Function/Number Decoder 46 (FIG. 2)

Function/number decoder 46 firstly distinguishes Up from Down commands and secondly channel number digit inputs from commands. An inverter 122, an AND 124, an AND 126, a NOR 128 and a NOR 130 form circuitry for distinguishing an Up from a Down command. NOR 128 and NOR 130 form a direct coupled RS flip/flop. The flip/flop remains in either of its two stable states, as indicated by the output signal level of NOR 128, until the signals at its inputs are changed to correspond to the other state. Its input signal levels are determined by two of the four possible combinations of 0 and 1 signal levels at the outputs of AND 124 and AND 126. When both inputs are at the same signal level (i.e., 0—0) no change in state occurs. The output of NOR 128 is at 1 for an Up command and at 0 for a Down command. For timing considerations an Up or Down command determination is made prior to differentiating between commands and digits.

The output of NAND 100 in zero converter 47 is connected through inverter 122 to one input each of AND 124 and AND 126. Lead A is connected to the second input of AND 126 and Lead B is connected to the second input of AND 124. The output of AND 124 connects to one input of an OR 132 and one input of NOR 128. The output of AND 126 is connected to the second input of OR 132 and to one input of NOR 130. The outputs of NOR 128 and 130 are cross-connected to their second inputs. An UP/DN signal is taken from the output of NOR 128 and supplied to a four stage address counter 142 for determining its direction of advancement. The counter does not count or advance at this time however. The output signal of OR 132 provides a reset pulse signal labelled RESET, which will be explained later.

Assume an Up command input (keyboard representation 1101). C' and D' are at 1 and the output of NAND 100 is at 0. The 0 signal level, through inverter 122, results in the corresponding inputs of AND 124 and AND 126 being at 1. Since B is at 0 and A is at 1, the second input of AND 124 is at 0 and the second input of AND 126 is at 1, making the outputs of AND 124 and AND 126 at 0 and 1, respectively. With these signals supplied to the flip/flop, the output of NOR 128 is at 1, indicating an Up command.

Similarly, with a Down command (keyboard representation 1110) the output of NOR 128 attains a 0 signal level. For all other allowable input signals from the keyboard, at least one input each of AND 126 and AND 124 is at 0, these signals have no effect on the state of the flip/flop, which is solely determined by Up and Down commands.

As mentioned, an Up command results in the outputs of AND 124 and AND 126 being at 0 and 1, respectively, causing the output of OR 132 (RESET) to assume a 1 level. A Down command results in the output of AND 124 and AND 126 being at 1 and 0, respectively, and the output of OR 132, is also at a 1. However, it may be shown that for any other keyboard input the output of OR 132 and the corresponding RESET signal is at 0. Thus, the units and tens flip/flop 162 of FIG. 3, which receives the RESET pulse signal, is reset when an Up or a Down command is entered at the keyboard. The only other binary input which could produce a 1 level RESET signal is 1111, which input is not possible with the keyboard circuit arrangement.

Function/number decoder 46 further distinguishes commands from digits. The output of OR 132 is connected to a second input of AND 134 and through an inverter 133 to the second input of AND 136. It will be recalled, that the first inputs of AND 134 and AND 136 receive the time-delayed enabling signals from the output of AND 116. The output of AND 134, labelled U/DI is an Up or Down initiate pulse. It has a 1 level for the period between the 30th and 31st $\overline{\phi_1}$ at 1 pulses when a command has been received. At all other times U/DI is at 0. U/DI 1 causes four stage address counter 142 to advance one count in a previously determined direction, under conditions to be more fully described below. The output of AND 134 is also connected to one input of a NOR 138. The output of AND 136, labelled WI for "write initiate", is a one level pulse during the period between the 30th and 31st $\overline{\phi}$ at 1 pulses when a digit has been entered at the keyboard and at all other times, WI is at 0.

The output of AND 136 is also supplied to one input of a NOR 140, which together with a NOR 138, form a second direct coupled RS flip/flop. NOR 140 assumes and maintains a 1 signal level output for commands and a 0 signal level output for digits. One input of NOR 138 is connected to the output of AND 134 and the outputs of NOR 138 and NOR 140 are cross-connected to form second inputs. The state of the flip/flop is indicated by the signal level on the output of NOR 140, labelled U/D, and inhibits or enables AND 156 which is part of the logic for controlling address counter 142.

For a digit input, the output of OR 132 is at 0 and in conjunction with a signal level of 1 on the output of AND 116 in time delay circuit 45, results in the outputs of AND 134 and AND 136 being at 0 and 1, respectively. Under these input conditions to the flip/flop, the output of NOR 140 is at 0.

A command input results in the output of OR 132 being at 1 which causes the outputs of AND 134 and AND 136 to be at 1 and 0, respectively, and the output of 140 to be at 1. As described for the first RS flip/flop, 0 on the outputs of AND 134 and AND 136 (which occurs for the keyboard rest condition input of 0000) has no effect upon the state of the flip/flop. Thus the output of NOR 140 (U/D signal) is at 1 for Up or Down commands and at 0 for digit inputs.

Address Control 48 (FIG. 2)

Address control 48 has a switch-controlled operate and program mode. In the program mode, 15 of 16 possible memory positions in units memory 174 and tens memory 176 (FIG. 3) are sequentially accessible by address counter 142 for loading or storing channel information. The particular location is the 16th position called a "scratch pad" memory position and is the one used by the viewer for direct access with a channel number input in the operate mode. In that mode, the channel tuning information previously stored at the 15 positions may be sequentially recalled by Up and Down commands. Also, in this mode provision is made for accessing the particular location by a digit input from keyboard 43 which automatically drives address counter 142 to the 16th or "scratch pad" memory position, thereby "skipping" all other memory positions. Thus the viewer may directly enter a desired channel number in the tuning system without sequencing through the various memory positions. The principal distinction between the modes is that channel number information may only be stored while the address control is in the program mode. Tuning, by direct access occurs in the operate mode and by sequencing the memory positions, in either mode.

Address control counter 142 is a 4-stage reversible binary counter having 16 possible states corresponding to the 16 addressable positions of the memory. When a 1 level signal is applied to reset terminal R, the counter assumes a 0000 state. The counter advances one count each time a 1 level signal is applied to clock terminal C. The direction of counting is dependent upon the UP/DN signal applied to the DIR terminal of the counter and is up (increase) for a 1 level signal and down (decrease) for a 0 level signal. The output leads of counter 142, labelled MA, MB, MC and MD are connected to the memory. The signals thereon constitute a binary coding of the addresses of the memory positions. MA, MB, MC and MD are connected to the inputs of a NOR 144 whose output is connected to one input of an AND 146 and to one input of an OR 148. The second input of OR 148 is connected to an output of an AND 150 in FIG. 3. (The inputs to AND 150 are connected to a pair of signal leads labelled ZU and ZT indicating the status of the units and tens memories. Leads ZU and ZT will be at a 1 level when the output of the corresponding memory position indicates respectively a 0 units or 0 tens digit.) The UP/DN signal from NOR 128 is applied to the DIR terminal of counter 142. The WI pulse signal from the output of AND 136 is supplied to one input of an AND 152. A program/operate switch 151 has its movable wiper connectable between ground and a resistor 154, the other end of resistor 154 being connected to a source of voltage +V. Switch 151 is schematically indicated by a dashed-line box. When switch 151 is closed, the system is in the program mode and a 0 level voltage (ground) is applied to junction 153. Conversely, when switch 151 is open, the operate mode is established and junction 153 is at a 1 level voltage. Junction 153 is connected to the second input of AND 152, an input of AND 156 and through an inverter 155 to a second input of AND 146. The output of AND 152 is connected to the R terminal on address counter 142. The U/D lead from NOR 140, the output of OR 148 and lead carrying timing pulse $\overline{\phi}_1$ are connected to the remaining inputs of AND 156. Timing pulse $\overline{\phi}_1$ is also supplied to the remaining input of AND 146. The outputs of AND 146 and AND 156 and an Up/Down Initiate (U/DI) lead from the output of AND 134 are connected to the inputs of an OR 158 whose output is connected to the clock terminal (C) of address counter 142.

The address of the "scratch pad" memory position in memory 50 is chosen to be a configuration of 0000 in counter 142. Access to this position can be had only in the operate mode and only when a digit is entered at the keyboard. The means for accessing the scratch pad location may now be described. The write initiate (WI) signal, which is a one clock period duration pulse from AND 136 is indicative of such a digit input and enables AND 152 by establishing an input thereof at 1. In the operate mode, switch 151 is open and junction 153 is at a 1 level voltage. Therefore, the second input of AND 152 is at 1 and the output of AND 152 (terminal R) is at a 1 level causing address counter 142 to reset to 0000. Thus, receipt of a WI pulse signal in the operate mode automatically causes counter 142 to read 0000, which is the scratch pad or direct access position in memory 50. The desired channel number information from the viewer is stored in the "scratch pad" position until a subsequent command or digit input is received. In the program mode AND 152 is inhibited because switch 151 is closed thereby establishing a signal level of 0 at one input of AND 152.

An Up or Down command, in either the program or operate mode, results in address counter 142 advancing in the direction determined by the signal on the UP/DN lead which is applied to the counter DIR terminal. Normally, both outputs of AND 146 and AND 156 will be at 0. The U/DI signal is also a short duration pulse (one clock cycle). When the U/DI lead is at a 1 level, in response to a command input, the output of OR 158 is at a 1 level and counter 142 is advanced one count in response to the 1 level signal on its C terminal. The U/D signal, which it will be recalled is a 1 level for a command and a 0 level for digit, is coupled to an input of AND 156 to either inhibit or enable advancement of counter 142 through AND 156.

Assume an Up (or Down) command is given in the operate mode resulting in address counter 142 advancing to the 0000 position. While the example is not realizable in the system except under highly transient conditions, it will serve as a good illustration of how the scratch pad memory position is skipped thereby preventing access to that location. The 1 level at junction 153 enables AND 156 and inhibits AND 146. A command input places the U/D lead at 1 (the second input of AND 156). The 0000 in counter 142 places the output of NOR 144 at 1 and this signal level is applied to an input of OR 148 which causes its output to be at 1, irrespective of its other input signal level. The 1 level output of OR 148 is connected to the third input of AND 156. When the $\overline{\phi}_1$ clock pulse is at 1 the four inputs of AND 156 are at 1 and therefore its output is at 1. Any 1 level input to OR 158 causes its output to be at 1 which advances address counter 142 by one binary count. Thus the counter "skips" to the next address and the "scratch pad" position is inaccessible by command input when in the operate mode. Under the same assumed conditions in the program mode, junction 153 is at 0, inhibiting AND 156, but through inverter 155 produces a one level signal at an input of AND 146. The output of NOR 144 is at 1 (0000 counter condition) and hence the second input of AND 146 is at 1. When the $\overline{\phi_1}$ at 1 timing pulse is received, the three inputs of AND 146 are at 1 and its output assumes a 1 level. Since the output of AND 146 is connected to OR 158, its output is at 1 and counter 142 is again advanced. Thus counter 142 is forced to skip the "scratch pad" position when an Up or Down command is received in either mode.

In the operate mode, any memory position with a stored 00 channel number is also skipped. For memory positions other than the "scratch pad" position, the output of NOR 144 which is coupled to an input of OR 148 is at 0. The second input of OR 148 is coupled to the 1 level output of AND 150 (FIG. 3) (because leads ZU and ZT are at 1). Therefore, the output of OR 148 is at 1, and in conjunction with the three other 1 signal levels on the inputs of AND 156, causes its output to be at 1. Just as in the case of the "scratch pad" skipping action, a 1 level inhibiting signal at an input of OR 158 causes a 1 level signal at the C terminal of address counter 142, advancing it by one count. Thus in the operate mode, a 00 channel number at a memory position results in address counter 142 being driven to the next sequential memory position. This skipping does not occur in the program mode because junction 153 is at a 0 level which inhibits AND 156 (through which a 1 level signal at the output of OR 148 must act) and thus each memory position (except the 16th is sequentially accessible by Up or Down commands).

Figure 3:
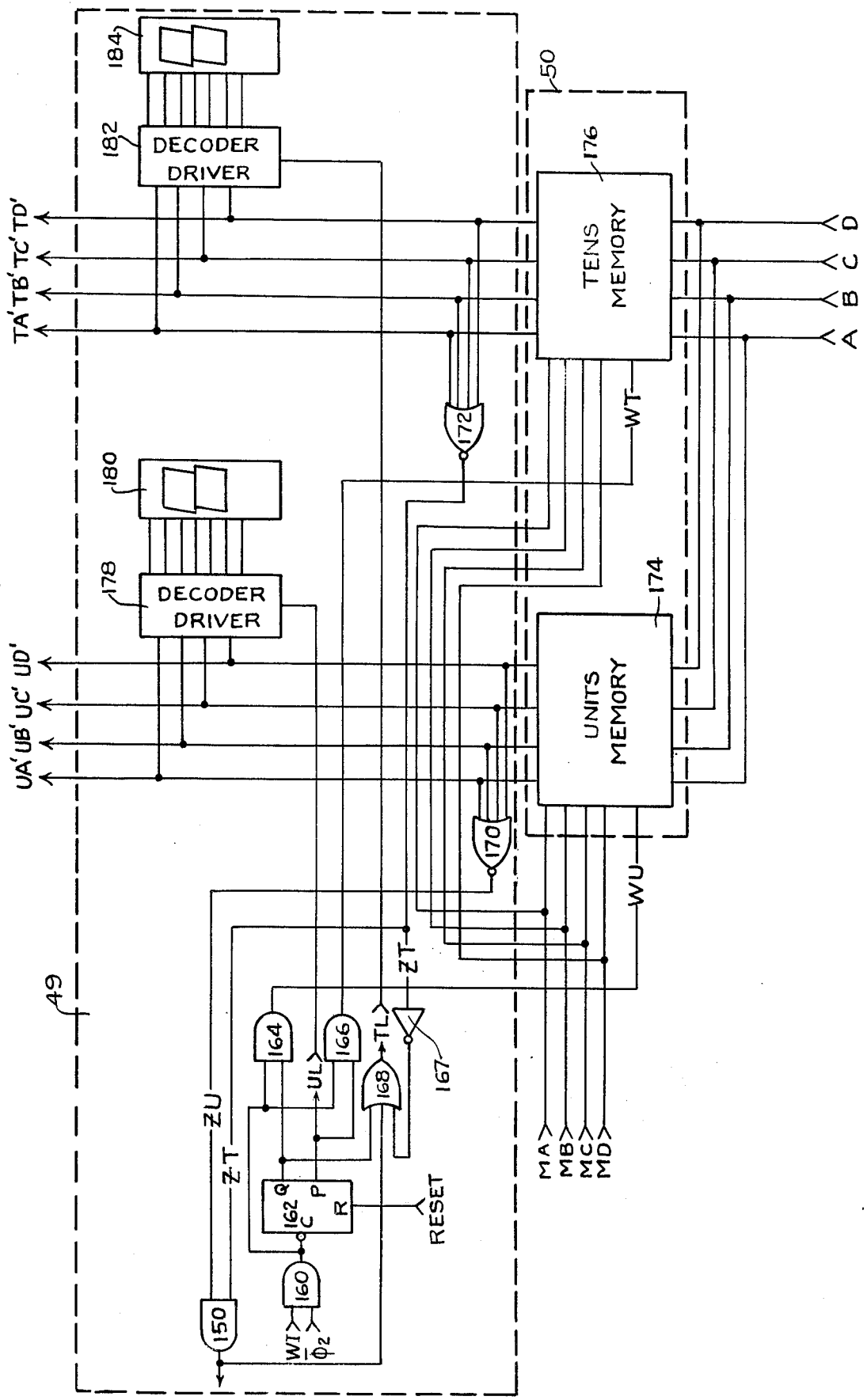
FIG. 3 shows the units and tens memories of block 50, and the decoding and display circuitry of block 49.

Decode Display System 49 and Memory 50 (FIG. 3)

Decode display 49 comprises circuitry for identifying units and tens digits from keyboard 43, based on their order of entry, and for activation of the appropriate write-enable signals which permit information to be stored in the corresponding memory. The circuitry also controls blanking and illuminating of the channel number display in a manner which aids the viewer in utilizing the tuning system.

Memory 50 consists of circuitry providing 16 memory positions for recording two digit channel numbers represented by four bits each for the tens and units digits. The memory is shown in two portions, allowing separate write-in and read-out of units and tens channel digit information. Counter 142 of address counter 48 (FIG. 2) designates the address of a memory position in both memories. The signal levels at the outputs of the counter activate the common memory address inputs. The signal levels on leads A, B, C and D are applied to the memories but are not effective until a write-enable signal is received. The write-enable signal serves to guard the memory inputs from spurious signals. The memory outputs are not guarded and stored channel information at the designated position is always available.

The WI pulse signal generated at the output of AND 136 (FIG. 4) is applied along with the $\overline{\phi_2}$ timing signal from the clock pulse generator to the inputs of an AND 160. The output of AND 160 is connected to a clock terminal (C) of a flip-flop 162 and to one input each of an input of an AND 164 and of an AND 166. The Q output of flip-flop 162 connects to the second input of AND 164 and to one input of an OR 168. The P output of flip-flop 162 supplies a units display control signal, labelled UL, which is coupled to decoder divider 178 and to the second input of AND 166. The output of AND 164, labelled WU, connects to units memory 174 and the output of AND 166, labelled WT, connects to tens memory 176. The WU and WT signals correspond to the write commands for the units and tens memories, respectively. These signals assume a 1 level when permitting writing into the memories and a 0 level when preventing writing into the memories.

The output of a NOR 170, labelled ZU, is connected to one input of an AND 150. The output of a NOR 172, labelled ZT, is connected to the second input of AND 150 and, through an inverter 167, to the second input of OR 168. As mentioned in the previous discussion of FIG. 2, the output of AND 150 connects to the second input of OR 148. It is also connected to the third input of OR 168. The output of OR 168, labelled TL, connects to decoder driver 182 to provide control of the tens display 184. A UL and TL signal level of 1 enables display of the respective units and tens digits while a 0 signal level causes blanking.

Units memory 174 and tens memory 176 are connected to the leads A, B, C and D bearing the binary coded signals from the keyboard. Leads MA, MB, MC and MD from address counter 142 in FIG. 4 comprise the address leads for both memories. Units memory 174 has output leads UA', UB', UC' and UD' connected to NOR 170 for supplying the ZU signal and tens memory 176 has output leads TA', TB', TC' and TD' connected to NOR 172 for supplying the ZT signal. The ZU and ZT leads indicate the presence of 0000 in the memories. Thus, when the stored channel number includes a 0 units or tens digit, the corresponding ZU or ZT lead is at a 1 level.

Decoder driver 178 is also connected to the output leads of units memory 174 and drives a display device 180 for visually displaying the units digit. Similarly, the output leads of tens memory 176 are coupled to a decoder driver 182 which, through its display device 184, permits visual display of the tens digit. Any appropriate combination of decoder driver and display device may be used. Suitable units are manufactured by the Sperry Corporation under the model numbers DD700 and SP752, respectively.

In an actual embodiment of the tuning system incorporating the invention, eight 4-word by 8-bit capacity memory modules, similar to RCA CD 4036 AE are employed. The memories are used in a 4-word by 4-bit configuration to allow separate access to the units and tens digits. Four such memory modules are combined to provide the 16 units memory positions and four more are combined to provide the 16 tens memory positions. It is obvious that many other standard components may be selected and appropriately arranged to provide the same memory capacity and accessibility, and the memory itself, as distinct from the means incorporating it into the tuning system, is not part of the present invention.

An alternative standard memory unit which is easily adaptable to the preferred embodiment is a type SN 7489 64-bit read-write memory manufactured by Texas Instruments, Inc. This device, as described in Bulletin No. DL-S 7211386, February, 1971 — revised December, 1972, allows 16-word by 4-bit storage with a 4-bit data input, 4-bit address input selection and memory enable and write enable signal leads. Thus, one such device may be used for units memory 174 and one for tens memory 176. The minor modifications to the SN 7489 memory are as follows: the memory enable input must be maintained at a 0 level; an inverter must be added to the write enable input so that the WU or WT write enable signals produce zero level enable pulses; and the 4 sense outputs from this device must each be inverted so that there is a correspondence with the binary coding employed for the memory data input which is the standard binary representation.

Flip-flop 162 is a two state device which distinquishes tens from units digits based on their order of entry at the keyboard and may be employed to serially access the memory modules. Whenever a number is entered, it will be recalled that a 1 level WI pulse signal is generated. This, together with a 1 level $\overline{\phi_2}$ pulse (during the compare interval) at the input of AND 160 provides a 1 level output pulse to flip-flop 162. The trailing edge of this latter pulse changes the state of the flip-flop. Flip-flop 162 may also receive a RESET signal from the output of OR 132 in FIG. 2 which will cause it to assume a particular state so that the next digit received will be treated as a tens digit. The state of the flip-flop is determined by the signal levels at its Q output and P outputs. For the first state, the Q output is 0 and correspondingly the P output is at 1, while the second state has the reverse relationship. It will be recalled from the discussion of FIG. 2 that the RESET signal is produced only by entry of an Up or Down command at keyboard 43. When such a command is given, flip-flop 162 has its P output at a 1 level and is in its first state ready for entry of a tens digit.

The channel number displays operate in a predetermined sequence in response to entry of successive digits. The tens display is blanked for all complete channel numbers less than 10 and the units display is blanked whenever a tens digit is entered. This arrangement serves as a valuable tuning aid for the viewer. Blanking of the tens display avoids a non-standard tens-position 0 for channel numbers less than 10 and is commonly known as leading zero suppression. Thus, while channel 2 is entered at the keyboard as 02, it is displayed as 2.

The units display is blanked immediately after entry of a tens digit to inform the viewer that the selection process is incomplete. This arrangement is advantageous since a channel number is entered one digit at a time, with the first or tens digit being displayed on the left and the second or units digit being displayed on the right. Thus blanking of the units display upon entry of a tens digit informs the viewer that only a single (tens) digit has been entered. Entry of a units digit completes the desired tuning and the display shows the entered channel number. For example, if channel 21 is being displayed and the viewer wishes to change tuning to channel 73, entry of the tens digit 7 results in the tens display reading 7 and the units display being blanked. Upon subsequent entry of the units digit 3, the system tunes to and displays channel number 73.

The units display is directly controlled by the UL signal from the P output of flip-flop 162. When P is at 1 (first state of flip-flop 162) the units digit is displayed. Upon entry of a first (tens) digit, the WI signal (through AND 160) drives flip-flop 162 to its second state; P is now at 0 and the units display is blanked.

Upon entry of a second (units) digit, flip-flop 162 resumes its first state (P at 1) and enables display of the units digit. The tens digit is blanked when all inputs of OR 168 are at 0. This condition is met when flip-flop 162 is in its second state (Q at 0), ZT is at 1 and either ZU or ZT is at 0.

Leads A, B, C and D are directly connected to units memory 174 and to tens memory 176. If the keyboard input is a command, no WI pulse signal is produced, neither memory receives a write-enable (WU or WT) signal, and the information on the leads is not stored in the memory. However, counter 142 always "addresses" a memory position to which the tuning system responds (by tuning to the frequency corresponding to the channel number information stored at that memory position). Entry of a digit produces a WI pulse signal, which in the operate mode automatically results in address counter 142 assuming its 0000 count (the particular location or scratch pad memory position) and, depending upon the WU and WT signal levels, writes the information into the appropriate memory by overwriting any previously stored information. Thus the memory is "loaded" or written into only when the WU or WT signal is at 1, as determined by flip-flop 162.

The invention disclosed provides a sequentially accessible multi-position memory providing storage and recall of selected channel information for an all electronic tuning system. The tuning system has program and operate modes corresponding to the storage and recall of channel number information and a particular or scratch pad location which is accessible only in the operate mode to provide the viewer with direct access to tune the receiver without destroying the programmed channel number sequence.

While a particular embodiment of the invention has been shown and described, it will be obvious to those skilled in the art that changes and modifications may be made without departing from the invention in its broader aspects, and, therefore, the aim in the appended claims is to cover all such changes and modifications as fall within the true spirit and scope of the invention.

What is claimed is:

1. An all-electronic television tuning system comprising:
voltage controllable oscillator means for selectively tuning a plurality of fixed frequency bandwidth television channels in a predetermined range of frequencies;
encoding means converting the tuning frequency of said oscillator means into channel number information;
channel number selection means;
comparison means comparing channel number information from said encoding means and said selection means;
voltage generating means for changing the tuning frequency of said voltage controllable oscillator means under the control of said comparison means;
memory means coupled between said selection means and said comparison means including a plurality of memory locations;
said television tuning system having a program mode permitting the storage of channel number information from said selection means in said memory means, an operate mode permitting recall of channel number information from said memory means for supplying input information to said comparison means and means coupled to said memory means for establishing either of said modes; and said memory means having a particular location accessible only in said operate mode for channel number information storage to cause immediate tuning to the corresponding channel.

2. The tuning system of claim 1 further including means for accessing said particular location in said memory means in response to a channel number input to the channel number selection means during said operate mode.

3. The tuning system of claim 2 wherein said means for accessing includes address control means responsive to said channel selection means for designating said memory locations and establishing access thereto for storage and recall of channel number information.

4. The tuning system of claim 3 wherein said address control means further includes means for preventing access to said particular location in said program mode.

5. The tuning system of claim 4 wherein said address control means further includes a resettable binary counter for serially designating and accessing said memory locations.

6. The tuning system of claim 5 wherein said address control means further includes means for advancing in said operate mode said binary counter to designate a next serial memory location when the stored channel number information is 00.

7. The tuning system of claim 5 wherein the address of said particular location corresponds to the reset configuration of said binary counter.

8. The tuning system of claim 7 wherein said memory means comprises separate and distinct memory modules for the storage of units and tens digits.

9. The tuning system of claim 8 further including means for sequentially accessing said memory modules in accordance with the order of digit input at the channel number selection means.

10. The tuning system of claim 9 wherein the total number of memory locations is 16, 15 of which are accessible in the program mode permitting the serial storage of 15 two digit channel numbers.

* * * * *